(12) United States Patent
Guillemoles et al.

(10) Patent No.: US 9,627,564 B2
(45) Date of Patent: Apr. 18, 2017

(54) OPTOELECTRONIC DEVICE COMPRISING NANOSTRUCTURES OF HEXAGONAL TYPE CRYSTALS

(75) Inventors: Jean-Francois Guillemoles, Paris (FR); Par Olsson, Solna (SE); Julien Vidal, Bages (FR); Alexandre Freundlich, Houston, TX (US)

(73) Assignees: Electricite de France, Paris (FR); Centre National de la Recherche Scientifique (CNRS), Paris (FR); University of Houston, Houston, TX (US)

(*) Notice: Subject to any disclaimer, the term of this patent is extended or adjusted under 35 U.S.C. 154(b) by 0 days.

(21) Appl. No.: 13/821,670

(22) PCT Filed: Sep. 9, 2010

(86) PCT No.: PCT/US2010/048242
§ 371 (c)(1),
(2), (4) Date: Mar. 8, 2013

(87) PCT Pub. No.: WO2012/033493
PCT Pub. Date: Mar. 15, 2012

(65) Prior Publication Data
US 2013/0168725 A1 Jul. 4, 2013

(51) Int. Cl.
*H01L 33/00* (2010.01)
*H01L 31/0368* (2006.01)
(Continued)

(52) U.S. Cl.
CPC ...... *H01L 31/03682* (2013.01); *H01L 31/028* (2013.01); *H01L 33/18* (2013.01);
(Continued)

(58) Field of Classification Search
CPC ........... H01L 51/5004; H01L 2251/552; H01L 33/18; H01L 33/03682; H01L 31/03682;
(Continued)

(56) References Cited

U.S. PATENT DOCUMENTS

| 5,858,862 A | 1/1999 | Westwater et al. |
| 2003/0071275 A1 | 4/2003 | Torvik |

(Continued)

FOREIGN PATENT DOCUMENTS

| CN | 1682572 A | 10/2005 |
| CN | 101611505 A | 12/2009 |

(Continued)

OTHER PUBLICATIONS https://web.archive.org/web/20110614104658/http://www.ecse.rpi.edu/~schubert/Light-Emitting-Diodes-dot-org/chap04/F04-06%20Homo%20Hetero%20compariso.jpg.*

(Continued)

*Primary Examiner* — Eric Ward
*Assistant Examiner* — Eric Ashbahian
(74) *Attorney, Agent, or Firm* — Drinker Biddle & Reath LLP

(57) ABSTRACT

An optoelectronic device comprising: a first conductive layer, a second conductive layer, an active layer between the first conductive layer and the second conductive layer, wherein the active layer comprises a submicrometer size structure of hexagonal type crystals of an element or alloy of elements selected from the carbon group.

13 Claims, 4 Drawing Sheets

(51) Int. Cl.
*H01L 31/028* (2006.01)
*H01L 33/18* (2010.01)
*H01L 33/34* (2010.01)
*H01L 31/0312* (2006.01)

(52) U.S. Cl.
CPC .......... *H01L 33/34* (2013.01); *H01L 31/0312* (2013.01); *Y02E 10/546* (2013.01); *Y02E 10/547* (2013.01)

(58) Field of Classification Search
CPC ............... H01L 31/18; H01L 21/02507; H01L 31/035218; B82Y 20/00; B82Y 30/00; C30B 29/04; Y02E 10/545; Y02P 70/521; H01S 5/3031
USPC .................................. 257/99, 43, 76, 77, 78
See application file for complete search history.

(56) References Cited

U.S. PATENT DOCUMENTS

| | | | |
|---|---|---|---|
| 2005/0082554 A1* | 4/2005 | Torvik .................. | B82Y 20/00 257/85 |
| 2005/0126628 A1* | 6/2005 | Scher et al. .................. | 136/263 |
| 2005/0142384 A1 | 6/2005 | Itai | |
| 2006/0054888 A1* | 3/2006 | Ito et al. ......................... | 257/43 |
| 2007/0145394 A1 | 6/2007 | Shimizu et al. | |
| 2008/0079022 A1 | 4/2008 | Yamamoto et al. | |
| 2008/0210957 A1* | 9/2008 | Watanabe et al. .............. | 257/89 |
| 2008/0230782 A1* | 9/2008 | Antoniadis et al. ............ | 257/53 |
| 2008/0277676 A1 | 11/2008 | Hong et al. | |
| 2009/0189058 A1* | 7/2009 | Mitsui et al. .............. | 250/208.1 |
| 2010/0096622 A1 | 4/2010 | Iizumi et al. | |
| 2010/0127153 A1 | 5/2010 | Agarwal | |
| 2010/0216271 A1* | 8/2010 | Moon ............................. | 438/47 |
| 2011/0139233 A1* | 6/2011 | Zheng ................ | H01L 51/4226 136/256 |
| 2011/0203632 A1* | 8/2011 | Sen et al. ...................... | 136/244 |

FOREIGN PATENT DOCUMENTS

| | | |
|---|---|---|
| JP | 2010-062539 A | 3/2010 |
| WO | WO 2006/088877 A1 | 8/2006 |

OTHER PUBLICATIONS

Fontcuberta i Morral et al. Synthesis of Silicon Nanowires with Wurtzite Crystalline Structure by using standard Chemical Vapor Deposition. 19, 1347-1351 Adv Mater. 2007.*

Fontcuberta I Morral et al. Synthesis of Silicon nanowires with Wurtzite Crystalline Structure by using standard Chemical Vapor Deposition. 19, 1347-1351 Adv. Mater. 2007.*

Schubert, Fred E. Light-Emitting Diodes. 2nd Edition. Cambridge University Press p. 70 (2006).*

Guo et al. Layered Graphene/Quantum Dots for Photovoltaic Devices. Angew. Chem. Int. Ed. 49, 3014-3017 (2010).*

Zhang et al. Srable hexagonal-wurtzite silicon phase by laser ablation. Applied Physics Letters 75, 2758 (1999).*

Bandet et al., "Vibrational and electronic properties of stabilized wurtzite-like silicon," Journal of Physics D: Applied Physics, Institute of Physics Publishing, GB, vol. 35(3), pp. 234-239 (Feb. 7, 2002).

Fissel et al., "Formation of twinning-superlattice regions by artificial stacking of Si layers," Journal of Crystal Growth, Elsevier, Amsterdam, NL, vol. 290(2), pp. 392-397 (May 1, 2006).

Fontcuberta i Morral et al., "Synthesis of Silicon Nanowires with Wurtzite Crystalline Structure by Using Standard Chemical Vapor Deposition," Advanced Materials, Wiley-VCH Verlag, DE, vol. 19(10), pp. 1347-1351 (May 21, 2007).

Xu et al., "Facet-Dependent Electronic Properties of Hexagonal Silicon Nanowires under Progressive Hydroxylation and Surface Reconstruction," Nano Letters, American Chemical Society, USA, vol. 9(5), pp. 1999-2004 (May 13, 2009).

Office Action issued for AU 2010360267 (Mar. 12, 2014).

Yang et al., "Fabrication in-situ SiC nanowires/SiC matrix composite by chemical vapour infiltration process," Materials Letters, vol. 58, pp. 3145-3148 (2004).

Zhang et al., "Stable hexagonal-wurtzite silicon phase by laser ablation," Applied Physics Letters, vol. 75(18), pp. 2758-2760, (Nov. 1, 1999).

English Translation of Office Action issued for JP 2013-528173 (Jul. 22, 2014).

Fissel et al., "Epitaxial growth of non-cubic silicon," Microelectronics Journal, vol. 36, pp. 506-509 (2005).

Kim et al., "Hexagonal silicon formation by pulsed laser beam annealing," Materials Letters, vol. 27 (6), pp. 275-279 (Aug. 1996).

Kim et al., "High-resolution transmission electron microscopy study of pulsed laser beam crystallized Si thin film: the formation of hexagonal Si and defects," Thin Solid Films, vol. 292 (1-2), pp. 313-317 (Jan. 1997).

English Translation of Office Action issued for CN 201080069951.4 (Jun. 9, 2015).

* cited by examiner

OPTOELECTRONIC DEVICE COMPRISING NANOSTRUCTURES OF HEXAGONAL TYPE CRYSTALS

CROSS-REFERENCE TO RELATED APPLICATIONS

This application is the U.S. national phase of the International Patent Application No. PCT/US2010/048242 filed Sep. 9, 2010, the entire content of which is incorporated herein by reference.

FIELD

The present invention relates to an optoelectronic device, such as a photosensor, a light emitting device for example a laser or a diode, or a photovoltaic cell.

BACKGROUND

The deployment of optoelectronic devices such as photovoltaic cells on a large scale requires the use of thin film technologies so as to save in terms of primary material as well as for increasing the flow of production.

Most of the optoelectronic devices use silicon semiconductor components. Indeed, Silicon is an abundant element that is well controlled technologically.

However, Silicon in its diamond-like crystal phase has a small absorption coefficient in particular in the visible spectrum. A consequence of such weak absorption properties of Silicon is to require the use of great thickness of material (about 200 μm) to make effective optoelectronic devices, such as photovoltaic cells.

This has recently (early XXIst century) caused an increase in the price of Silicon crystal following a significant increase of the demand of Silicon crystal.

Moreover, the use of great thicknesses of materials requires the use of highly pure and very well crystallized Silicon and enforces strong constraints on the processes, which are the principal obstacles to the reduction of the costs.

Other materials may be used to manufacture thin film optoelectronic devices, such as photovoltaic cells having an active layer of the order of a few micrometers.

For example, one may use a-Si:H material to replace crystalline silicon in the active layer. However, the optoelectronic devices obtained by replacing the crystalline silicon by a-Si:H are not as efficient as the one comprising an active layer made of crystalline silicon.

The use of CdTe, CIGS active layers presents the drawback of being less developed technologically and using scarce elements.

SUMMARY

Thus, there is a need for optoelectronic devices comprising an active layer that would comprise a specific material that would be abundant, cheap, efficient and whose absorption coefficient in the visible spectrum would be greater than the absorption coefficient in the visible spectrum of crystalline silicon.

A goal of the present invention is to provide such improved optoelectronic devices.

The present invention relates to an optoelectronic device comprising:
a first electrically conductive layer (22), for example a first semiconductor contact layer,
a second electrically conductive layer (24), for example a second semiconductor contact layer,
an active layer between the first semiconductor contact layer and the second semiconductor contact layer, wherein the active layer comprises a submicrometer size structure of hexagonal type crystals of an element or alloy of elements selected from the carbon group.

The inventors have observed that hexagonal type crystals of an element or alloy of elements selected from the carbon group absorb light 10 to 100 times more efficiently than the diamond crystal of the same elements in the close infra red range; that is between 1 and 2 eV.

Thus, the efficiency of the active layer of the optoelectronic device according to the invention is increased and the active layer may be thinner and cheaper then when using amorphous or diamond crystal type silicon.

According to further embodiments of the invention, the device of this invention may comprise the following features alone or in combination:
- at least parts of the nanostructure of hexagonal type crystals have a layer structure,
- at least parts of the nanostructure of hexagonal type crystals have a filament structure,
- at least parts of the nanostructure of hexagonal type crystals have a dot structure,
- at least parts of the nanostructure of hexagonal type crystals are under a strain, for example axial or shear, in at least in one direction,
- the active layer has a thickness greater or equal to 10 nm and smaller or equal to 1000 nm,
- the element of the carbon group is silicon,
- the electronic affinity of the first conductive layer is lower than the electronic affinity of the active layer and the ionisation energy of the second conductive layer is greater than the ionisation energy of the active layer,
- the optoelectronic device further comprises between the active layer and the first conductive layer a first blocking layer having an electronic affinity substantially equal to the electronic affinity of the active layer and a ionisation energy lower than the ionisation energy of the active layer, the optoelectronic device further comprises between the active layer and the second conductive layer a second blocking layer having an electronic affinity greater than the electronic affinity of the active layer and an ionisation energy substantially equal to the ionisation energy of the active layer,
- the optoelectronic device is configured to be a photovoltaic cell,
- the optoelectronic device is configured to be a photosensor,
- the electronic affinity of the first conductive layer is greater than the electronic affinity of the active layer and the ionisation energy of the second conductive layer is lower than the ionisation energy of the active layer,
- the optoelectronic device further comprises between the active layer and the first conductive layer a first blocking layer having an electronic affinity substantially equal to the electronic affinity of the first semiconductor contact layer and an ionisation energy lower than the ionisation energy of the active layer, the optoelectronic device further comprises between the active layer and the second conductive layer a second blocking layer having an electronic affinity greater than the electronic affinity of the active layer and an ionisation energy substantially equal to the ionisation energy of the second conductive layer, the electronic affinity of the first blocking layer is lower than the electronic affinity of the second blocking layer and the ionisation energy of the first blocking layer is lower than the ionisation energy of the second blocking layer, the optoelectronic device is configured to be a light-emitting device, for example a diode or a laser, the first and/or second blocking layers are non-doped semiconductor or insulators layers,

BRIEF DESCRIPTION OF THE DRAWINGS

The novel features of this invention, as well as the invention itself, both as to its structure and its operation, will be best understood from the accompanying non limiting drawings and examples, taken in conjunction with the accompanying description, in which like reference characters refer to similar parts, and in which.

DETAILED DESCRIPTION

Figure 1A:
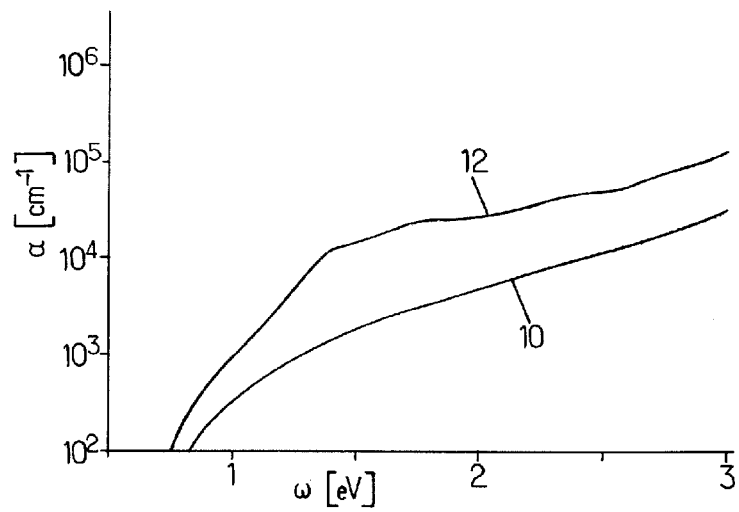
FIG. 1 represent the absorption coefficient of different crystalline phases of silicon.

Skilled artisans appreciate that elements in the figures are illustrated for simplicity and clarity and have not necessarily been drawn to scale. For example, the dimension of some of the elements in the figures may be exaggerated relative to other elements to help improve the understanding of the embodiment of the present invention.

According to the invention, the Hexagonal type crystal corresponds to the hP4 Pearson Symbol, or the P6$_3$/mmc space group.

According to an embodiment of the invention, the hexagonal type crystal may be a Hexagonal Diamond (Lonsdaleite) Structure or any deformation of such structure. In the sense of the invention a deformation is to be understood as a compression or extension applied to the structure or any strain applied to the structure, which, while maintaining its metastability, may remove in strict terms the hexagonal symmetry of the structure. The applied stress here is one applied to the active material by adjoining materials, either (for instance) following epitaxial growth with a lattice mismatch or to a difference of thermal expansion parameters after a growth at elevated temperature.

According to an embodiment of the invention, the element selected from the carbon group is carbon and/or silicon.

Processes for obtaining hexagonal silicon are known from the person skilled in the art. Specific processes are proposed in the following references:

Fissel et al., "Epitaxial growth of non-cubic silicon," Microelectronics Journal 36, no. 3-6 (Mars): 506-509, doi:10.1016/j.mejo.2005.02.064;

Fissel et al., "Formation of twinning-superlattice regions by artificial stacking of Si layers," Journal of Crystal Growth 290, no. 2 (Mai 1, 2006): 392-397, doi: 10.1016/j.jcrysgro.2006.02.009;

Jin Hyeok Kim et Jeong Yong Lee, "Hexagonal silicon formation by pulsed laser beam annealing," Materials Letters 27, no. 6 (Août 1996): 275-279, doi:10.1016/0167-577X(96)00019;

Jin Hyeok Kim et Jeong Yong Lee, "High-resolution transmission electron microscopy study of pulsed laser beam crystallized Si thin film:the formation of hexagonal Si and defects," Thin Solid Films 292, no. 1-2 (Janvier 5, 1997): 313-317, doi:10.1016/50040-6090 (96)09088-8;

Yan Zhang et al., "Stable hexagonal-wurtzite silicon phase by laser ablation," Applied Physics Letters 75, no. 18 (Nov. 1, 1999): 2758-2760, doi:10.1063/1.125140;

Twining in such crystals is also a way to induce local formation of the hexagonal phase (A. Fissel et al., "Formation of twinning-superlattice regions by artificial stacking of Si layers," Journal of Crystal Growth 290, no. 2 (Mai 1, 2006): 392-397, doi:10.1016/j.jcrysgro.2006.02.009.)

For the elements of the carbon group, the hexagonal phase has crystallographic parameters distinct from the thermodynamically stable phase, which makes it possible to stabilize it either by epitaxy on an adequate substrate, or by the application of adapted mechanical strains. Strains can also arise when growth was made at elevated temperature and when the layers have different thermal expansion from the substrate. Stain may also be induced due to specificities of deposition processes such as sputtering where the kinetic energy of the plasma ions is known to induce strain in the layers.

In the case of epitaxy, there is generally a critical thickness, which depends on the lattice mismatch, beyond which the phase spontaneously develops dislocations.

The inventors have been able to calculate the optical properties of hexagonal silicon and compare such optical properties with other crystal structure of silicon.

FIG. 1a represents the absorption coefficient of relaxed hexagonal silicon 10 and constrained hexagonal silicon 12 between 0.5 eV and 3 eV. The constrained hexagonal silicon corresponds to the relaxed hexagonal silicon compressed in the plane perpendicular to the z-axis.

FIG. 1a illustrates that applying a strain, for example compression in the plane perpendicular to the z-axis, allows increasing the absorption coefficient of the hexagonal crystal phase.

Figure 1B:
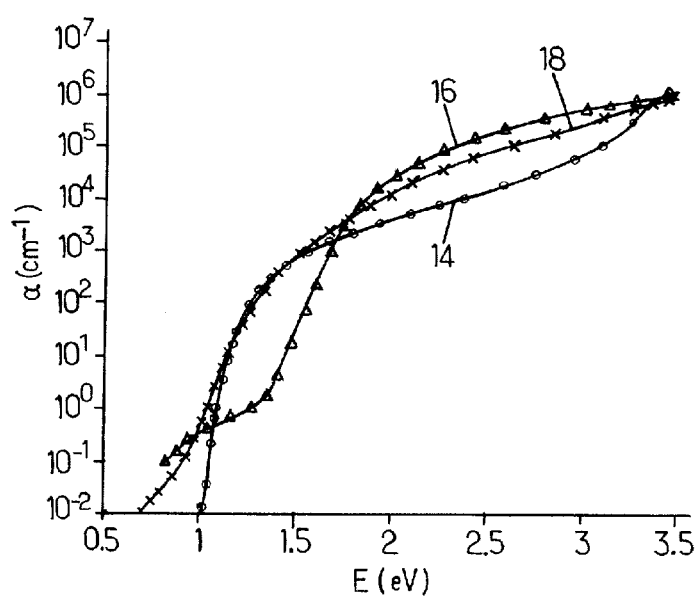

FIG. 1b represents the absorption coefficient of diamond crystal silicon 14, amorphous hydrogenated silicon 16, and microcrystalline silicon 18, between 0.5 eV and 3 eV.

Figure 1C:
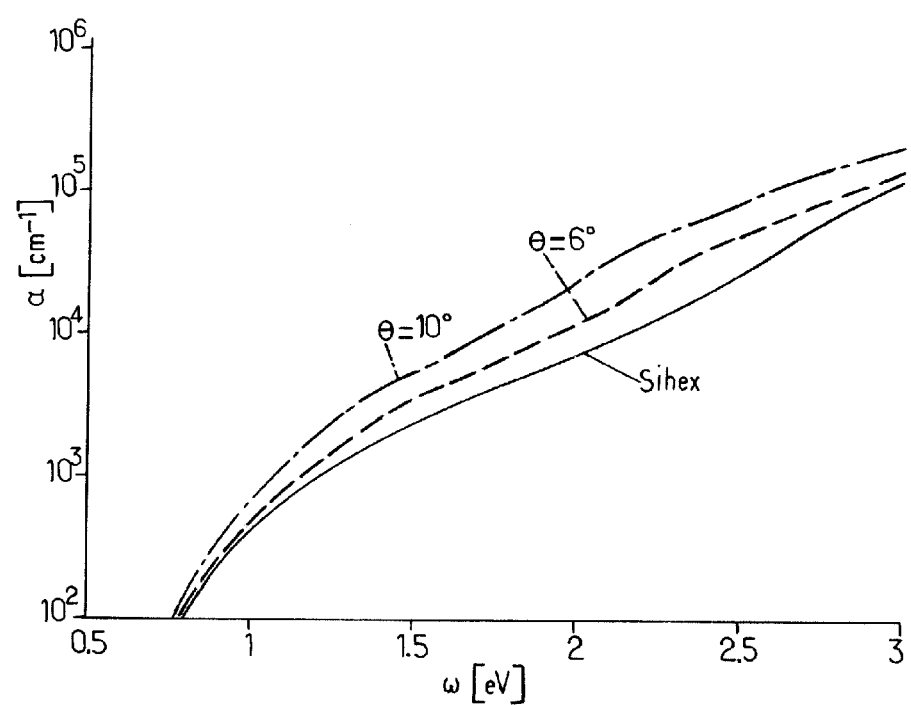

FIG. 1c represents the absorption coefficient of hexagonal silicon under different conditions of shear stress between 0.5 eV and 3 eV. The shear stress is applied parallel to the plane perpendicular to the z-axis and is defined by an angle Θ (in degree) between the primitive vector that is parallel to the z-axis in the perfect hexagonal lattice and the z-axis.

FIG. 1c illustrates that by applying a shear stress, parallel to the plane perpendicular to the z-axis, allows increasing the absorption coefficient of the hexagonal crystal phase.

As represented on FIGS. 1a and 1b, the absorption coefficient of relaxed hexagonal silicon 10 between 1 and 2 eV is at least ten times greater than the absorption coefficient of the diamond crystal silicon 14, amorphous hydrogenated silicon 16, and microcrystalline silicon 18.

Figure 2:
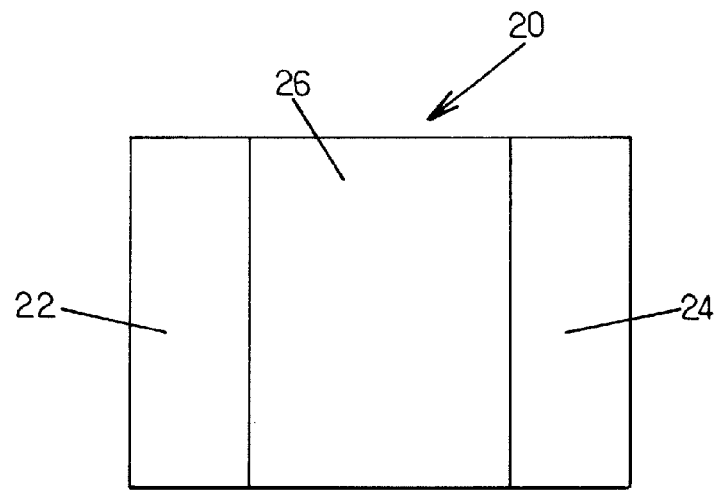
FIG. 2 shows the structure of an optoelectronic device according to a first embodiment of the invention.

FIG. 2 illustrates an optoelectronic device 20 according to an embodiment of the present invention. The optoelectronic device 20 comprises a first semiconductor contact layer 22, a second semiconductor contact layer 24 and an active layer 26 between the first 22 and second 24 semiconductor layers.

The active layer 22 comprises a submicrometer size structure of hexagonal type crystal of an element or alloy of elements selected from the carbon group.

According to an embodiment of the invention, submicrometer size structure of hexagonal type crystal comprised in the active layer has a layer structure. For example the hexagonal type crystal comprises a succession of layers of hexagonal type crystal and diamond crystal layers.

According to an embodiment of the invention, submicrometer size structure of hexagonal type crystal comprised in the active layer has a dot structure. For example, the hexagonal type crystal comprises a number of dots of hexagonal type crystal in a matrix of diamond crystal or amorphous hydrogenated silicon or microcrystalline silicon or a mix thereof.

According to an embodiment of the invention, submicrometer size structure of hexagonal type crystal comprised in the active layer has a filament structure. For example, the hexagonal type crystal comprises a number of filaments of hexagonal type crystal in a matrix of diamond crystal layers or amorphous hydrogenated silicon or microcrystalline silicon or a mix thereof.

According to an embodiment of the invention, the optoelectronic device may be a solar cell or a photo detector. According to such embodiment of the invention, the device is configured such that the electronic affinity of the first semiconductor contact layer 22 is lower than the electronic affinity of the active layer 26. The device according to such invention is further configured so that the ionisation energy of the second semiconductor contact layer 24 is greater than the ionisation energy of the active layer 26.

Advantageously, the electrons and holes are extracted more efficiently.

According to an embodiment of the invention, the optoelectronic device may be light emitting device, for example a diode, a led or a laser. According to such embodiment of the invention, the device is configured so that the electronic affinity of the first semiconductor contact layer 22 is greater than the electronic affinity of the active layer 26. The device according to such invention is further configured so that the ionisation energy of the second semiconductor contact layer 24 is lower than the ionisation energy of the active layer 26.

Advantageously, the electrons and holes are injected more efficiently.

Figure 3:
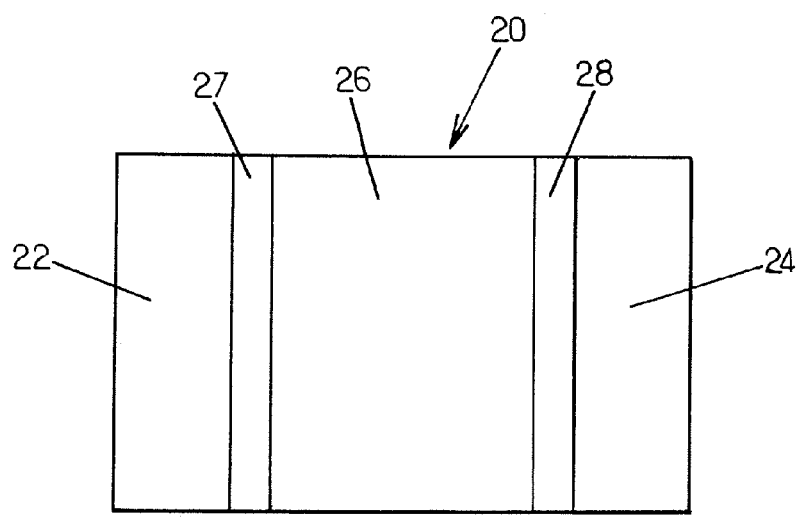
FIG. 3 shows the structure of an optoelectronic device according to a second embodiment of the invention.

For technological reasons it may be advantageous, as represented on FIG. 3, to have first and second blocking layers 27 and 28 between the active layer and the contact layers to block charge carriers of one type.

According to an embodiment of the invention the first blocking layer 27 may have an electronic affinity substantially equal to the electronic affinity of the active layer and an ionisation energy lower than the ionisation energy of the active layer. Furthermore, the second blocking layer 28 may have an electronic affinity greater than the electronic affinity of the active layer and an ionisation energy substantially equal to the ionisation energy of the active layer.

According to such embodiment of the invention, the optoelectronic device may be a solar cell or a photo detector.

According to an embodiment of the invention, the first blocking layer 27 may have an electronic affinity substantially equal to the electronic affinity of the first semiconductor contact layer 22 and a ionisation energy lower than the ionisation energy of the active layer 26. Furthermore, the second blocking layer 28 may have an electronic affinity greater than the electronic affinity of the active layer 26 and an ionisation energy substantially equal to the ionisation energy of the second semiconductor contact layer 24.

The electronic affinity of the first blocking layer 27 may be lower than the electronic affinity of the second blocking layer 28 and the ionisation energy of the first blocking layer 27 may be lower than the ionisation energy of the second blocking layer 28.

According to such embodiment of the invention, the optoelectronic device may be light emitting device, for example a diode, a led or a laser.

Figure 4:
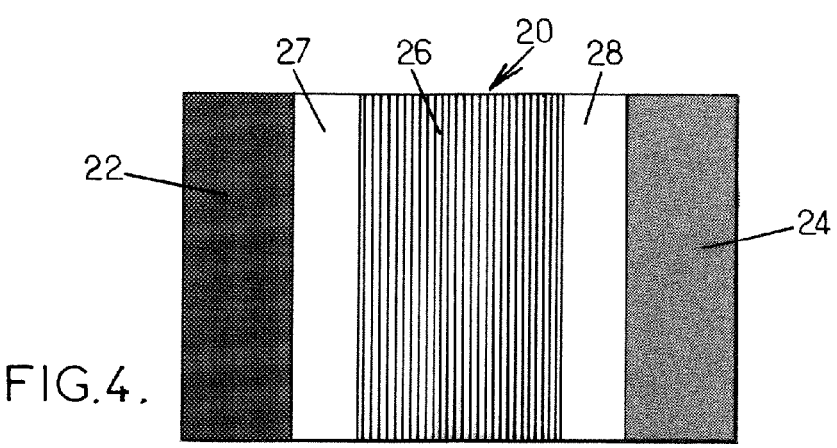
FIGS. 4 to 6 show examples of structures of optoelectronic devices according to the invention.

FIG. 4 illustrates an example of a structure 20 of a photo-detector or a solar cell according to the invention. The structure 20 comprises a first semiconductor contact layer 22 being an n-doped semiconductor layer and a second semiconductor contact layer 24 being a p-doped semiconductor layer. The active layer 26 of the structure contains a thin film of hexagonal silicon sandwiched between films whose structural parameters are adapted to the stabilization and the epitaxial growth of hexagonal silicon. The structure 20 further comprises un-doped blocking layers 27 and 28.

Figure 5:
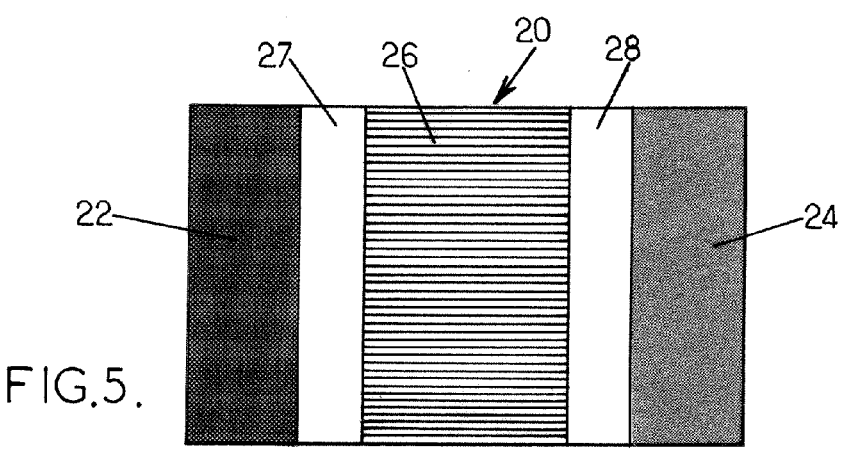

FIG. 5 illustrates an example of a structure 20 of a photo-detector or a solar cell according to the invention. The structure 20 comprises a first semiconductor contact layer 22 being an n-doped semiconductor layer and a second semiconductor contact layer 24 being a p-doped semiconductor layer. The active layer 26 of the structure contains filaments of hexagonal silicon grown in a matrix whose structural parameters are adapted to the stabilization and the epitaxial growth of hexagonal silicon. The structure 20 further comprises un-doped blocking layers 27 and 28.

Figure 6:
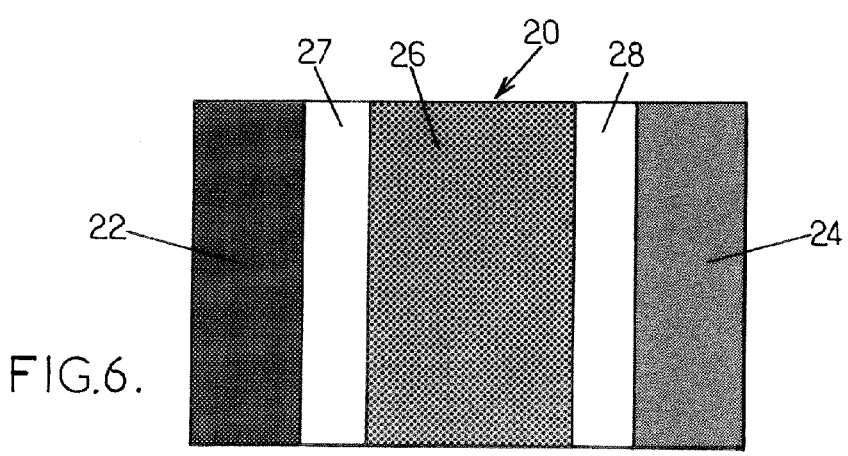

FIG. 6 illustrates an example of a structure 20 of a LED according to the invention. The structure 20 comprises a first semiconductor contact layer 22 being an n-doped semiconductor layer and a second semiconductor contact layer 24 being a p-doped semiconductor layer. The active layer 26 of the structure 20 contains hexagonal silicon particles. The structure 20 further comprises un-doped blocking layers 27 and 28. The active layer 26 has a band gap smaller than the band gap of the contact layers 22 and 24 and the blocking layers 27 and 28. The contact and blocking layers may consist of hydrogenated amorphous silicon. The contact layers are used for the injection of majority carriers which are trapped and recombined radiatively in the silicon hexagonal silicon particles.

The invention has been described above with the aid of embodiments without limitation of the general inventive concept.

The invention claimed is:

1. An optoelectronic device comprising:
   a first conductive layer,
   a second conductive layer,
   an active layer between the first conductive layer and the second conductive layer, wherein
   the active layer comprises a plurality of submicrometer size thin films of silicon in layer form having a hexagonal crystal structure, each thin film of silicon in layer form having a hexagonal crystal structure being sandwiched between silicon films with diamond crystalline structure,
   each thin film of silicon having a hexagonal crystal structure being stabilized through a permanent constraint exerted on two opposing sides of said thin film by silicon films with diamond crystalline structure, said permanent constraint originating from a lattice mismatch between silicon having a hexagonal crystal structure and the silicon having a diamond crystalline structure, and
   the thickness of each thin film of silicon having a hexagonal crystal structure being lower than a critical thickness beyond which the thin film develops dislocations.

2. The optoelectronic device according to claim 1, wherein at least parts of the submicrometer size layer having a hexagonal crystal structure is under a strain in at least one direction.

3. The optoelectronic device according to claim 1, wherein the plurality of submicrometer size thin films of silicon having a hexagonal crystal structure corresponding to the active layer has a thickness greater or equal to 10 nm and less than or equal to 1000 nm.

4. The optoelectronic device according to claim 1, wherein the electronic affinity of the first conductive layer is less than the electronic affinity of the active layer and the ionisation energy of the second conductive layer is greater than the ionisation energy of the active layer.

5. The optoelectronic device according to claim 4, wherein the optoelectronic device further comprises between the active layer and the first conductive layer a first blocking layer having an electronic affinity substantially equal to the electronic affinity of the active layer and an ionisation energy less than the ionisation energy of the active layer, the optoelectronic device further comprises between the active layer and the second conductive layer a second blocking layer having an electronic affinity greater than the electronic affinity of the active layer and a ionisation energy substantially equal to the ionisation energy of the active layer.

6. The optoelectronic device according to claim 4, wherein the optoelectronic device is a photovoltaic cell.

7. The optoelectronic device according to claim 4, wherein the optoelectronic device is a photosensor.

8. The optoelectronic device according to claim 1, wherein the electronic affinity of the first conductive layer is greater than the electronic affinity of the active layer and the ionisation energy of the second conductive layer is less than the ionisation energy of the active layer.

9. The optoelectronic device according to claim 8, wherein the optoelectronic device further comprises between the active layer and the first conductive layer a first blocking layer having an electronic affinity substantially equal to the electronic affinity of the first conductive layer and an ionisation energy less than the ionisation energy of the active layer, the optoelectronic device further comprises between the active layer and the second conductive layer a second blocking layer having an electronic affinity greater than the electronic affinity of the active layer and a ionisation energy substantially equal to the ionisation energy of the second conductive layer.

10. The optoelectronic device according to claim 9, wherein the electronic affinity of the first blocking layer is less than the electronic affinity of the second blocking layer and the ionisation energy of the first blocking layer is less than the ionisation energy of the second blocking layer.

11. The optoelectronic device according to claim 8, wherein the optoelectronic device is a light-emitting device.

12. The optoelectronic device according to claim 5, wherein the first and/or second blocking layers are non-doped semiconductor or insulators layers.

13. The optoelectronic device according to claim 9, wherein the first and/or second blocking layers are non-doped semiconductor or insulators layers.

* * * * *